(12) United States Patent  
Katayama et al.

(10) Patent No.: US 7,535,753 B2  
(45) Date of Patent: May 19, 2009

(54) SEMICONDUCTOR MEMORY DEVICE

(75) Inventors: Akira Katayama, Fuchu (JP); Nobuaki Otsuka, Komae (JP); Keiichi Kushida, Kawasaki (JP); Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 94 days.

(21) Appl. No.: 11/778,346

(22) Filed: Jul. 16, 2007

(65) Prior Publication Data

US 2008/0019194 A1    Jan. 24, 2008

(30) Foreign Application Priority Data

Jul. 19, 2006    (JP) ............... 2006-197259

(51) Int. Cl.
  *G11C 11/00* (2006.01)
  *G11C 5/06* (2006.01)
(52) U.S. Cl. ........................ 365/154; 365/63
(58) Field of Classification Search ................ 365/63, 365/154, 155, 156
  See application file for complete search history.

(56) References Cited

U.S. PATENT DOCUMENTS 6,301,186 B1* 10/2001 Naffziger ............... 365/230.05
6,535,453 B2* 3/2003 Nii et al. ................ 365/230.05
7,443,717 B2* 10/2008 Fujita et al. .................. 365/154
2008/0186752 A1* 8/2008 Kim ............................ 365/63

OTHER PUBLICATIONS

Koichi Takeda, et al., "A 16Mb 400MH$_z$ Loadless CMOS Four-Transistor SRAM Macro", IEEE International Solid-State Circuits Conference, 2000, 2 pages.
Kenji Noda, et al., "A Loadless CMOS Four-Transistor SRAM Cell in a 0.18-μm Logic Technology", IEEE Transactions on Electron Devices, vol. 48, No. 12, Dec. 2001, pp. 2851-2855.

* cited by examiner

*Primary Examiner*—Ly D Pham
(74) *Attorney, Agent, or Firm*—Oblon, Spivak, McClelland, Maier & Neustadt, P.C.

(57) ABSTRACT

A semiconductor memory device includes a first inverter circuit and a second inverter circuit, a first transfer gate which is connected between a first power node of the first inverter circuit and a first bit line, a second transfer gate which is connected between a second power node of the second inverter circuit and a second bit line, a first word line connected to gate terminals of the first transfer gate and the second transfer gate, a first read transistor connected between the first power node and a second word line, a second read transistor connected between the second power node and the second word line, and an application circuit which is connected to the second word line, and applies a read voltage to the second word line in reading data.

20 Claims, 11 Drawing Sheets

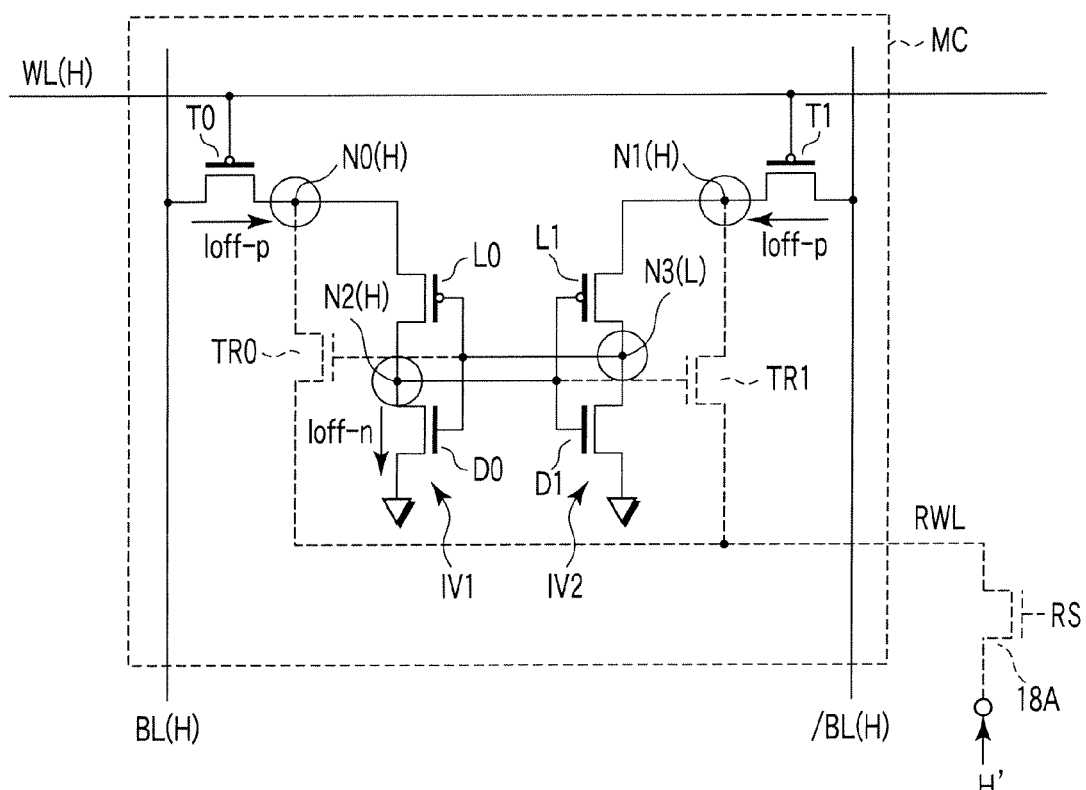
F I G. 4
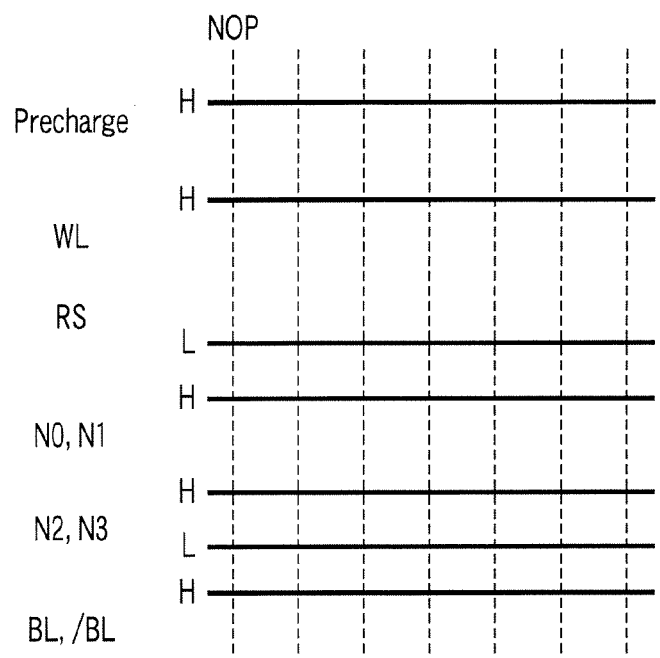
F I G. 5

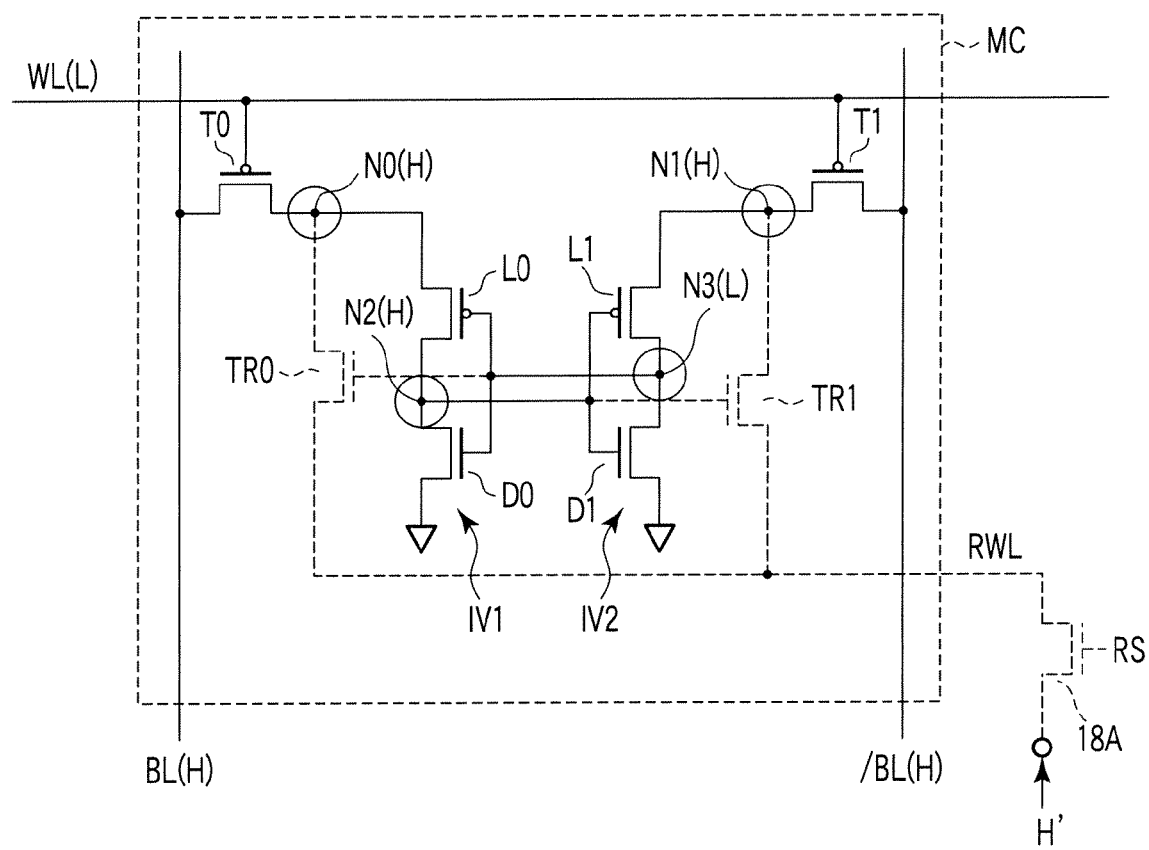
F I G. 12

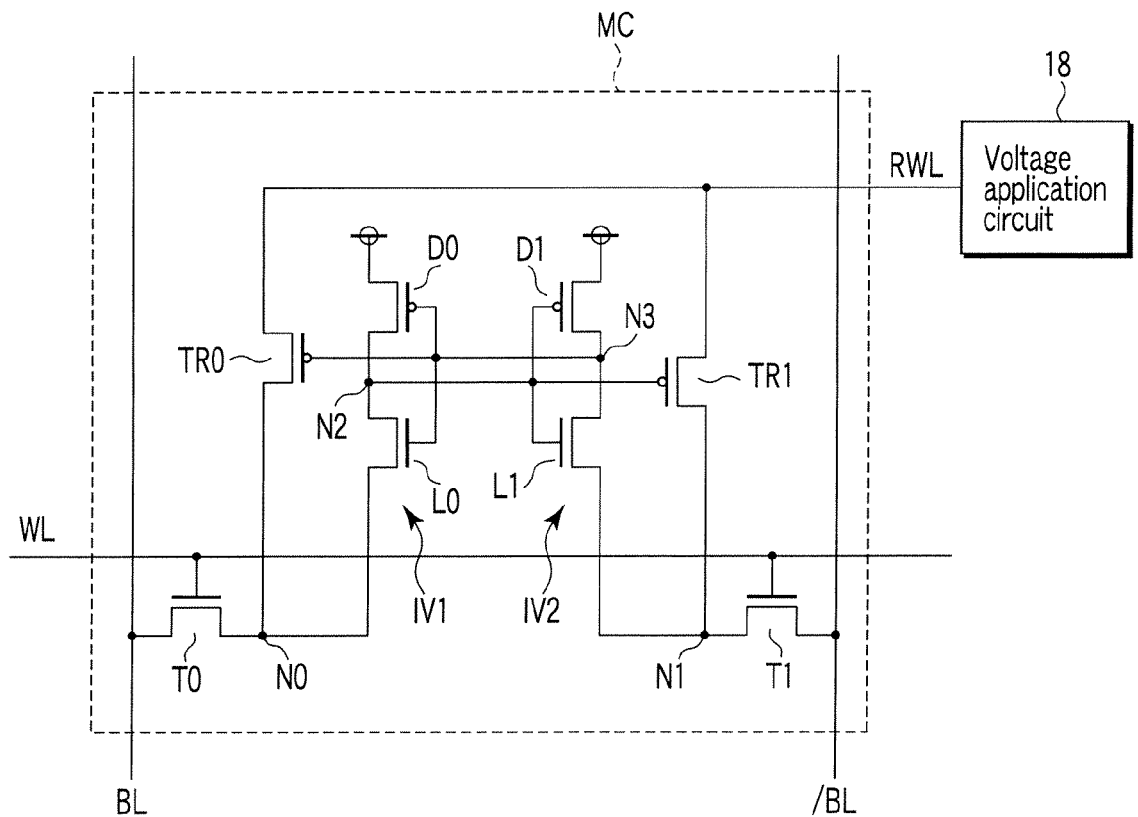
F I G. 13
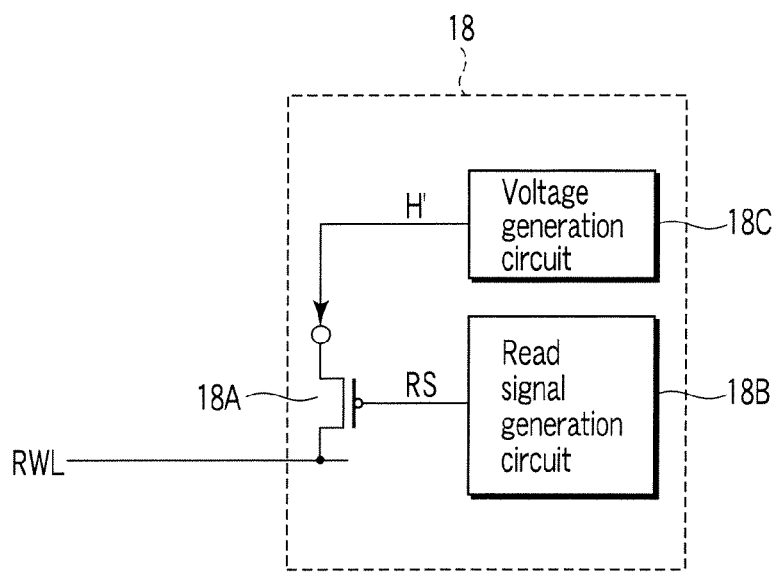
F I G. 14

SEMICONDUCTOR MEMORY DEVICE

CROSS-REFERENCE TO RELATED APPLICATIONS

This application is based upon and claims the benefit of priority from prior Japanese Patent Application No. 2006-197259, filed Jul. 19, 2006, the entire contents of which are incorporated herein by reference.

BACKGROUND OF THE INVENTION

1. Field of the Invention

The present invention relates to a semiconductor memory device and, more particularly, to, e.g., a static random access memory (SRAM).

2. Description of the Related Art

An SRAM is known as a type of semiconductor memory device. This SRAM uses an SRAM cell (6Tr. SRAM cell) formed by, e.g., six metal oxide semiconductor (MOS) transistors.

The 6Tr. SRAM cell comprises two inverter circuits. The output terminal of one inverter circuit connects to the input terminal of the other inverter circuit. The 6Tr. SRAM cell further comprises two transfer gates each of which connects a data storage node in the inverter circuits to a bit line in data read/write operation.

The static noise margin (SNM) is an index representing the operation margin of an SRAM. While a word line is selected and a bit line is precharged to a power supply voltage Vdd, the SNM corresponds to the length of one side of a square which can be written in a space surrounded by curves of superimposed input/output characteristics of two inverter circuits.

In the conventional 6Tr. SRAM cell, all unselected SRAM cells connected to a selected word line are disturbed while reading or writing data. This is because a storage node holding low data connects to a bit line precharged to a power supply voltage Vdd via a transfer gate. Even when the inverter circuit receives high data, the output does not drop to a low-level voltage (ground voltage Vss) due to this disturbance. This leads to a decrease in static noise margin (SNM) while reading or writing data.

Along with the advance in the micronization of a semiconductor integrated circuit, variations in a threshold voltage Vth and size (gate width and gate length) between transistors have become serious problems. The variation in characteristic between the transistors causes a variation in SNM on the low data hold side and the high data hold side. This decreases the SNM of the SRAM cell itself. The reason is as follows. That is, the SNM of the SRAM cell indicates a voltage at which data held in a storage node can withstand breakdown due to, e.g., noise. Accordingly, a smaller one of the two SNMs defines that of the SRAM cell.

From the viewpoint of element microfabrication and reduction in power consumption, the use of a lower power supply voltage for semiconductor integrated circuits is spreading. Consequently, the lower the power supply voltage, the smaller the static noise margin.

Techniques related to the above type are disclosed in reference 1 (Koichi Takeda et al., "A 16 Mb 400 MHz Loadless CMOS Four-Transistor SRAM Macro", NEC Corp., IEEE International Solid-State Circuits Conference, 2000), and reference 2 (Kenji Noda et al., "A Loadless CMOS Four-Transistor SRAM Cell in a 0.18-μm Logic Technology", IEEE Transactions on Electronic Devices, Vol. 48, No. 12, December 2001, pp. 2851-2855).

BRIEF SUMMARY OF THE INVENTION

According to a first aspect of the present invention, there is provided a semiconductor memory device comprising:

a first inverter circuit and a second inverter circuit formed by transistors;

a first storage node connected to an output terminal of the first inverter circuit and an input terminal of the second inverter circuit;

a second storage node connected to an input terminal of the first inverter circuit and an output terminal of the second inverter circuit;

a first transfer gate which is connected between a first power node of the first inverter circuit and a first bit line, and formed by a P-type transistor;

a second transfer gate which is connected between a second power node of the second inverter circuit and a second bit line, and formed by a P-type transistor;

a first word line connected to gate terminals of the first transfer gate and the second transfer gate;

a first read transistor which is connected between the first power node and a second word line, and formed by an N-type transistor having a gate terminal connected to the second storage node;

a second read transistor which is connected between the second power node and the second word line, and formed by an N-type transistor having a gate terminal connected to the first storage node; and an application circuit which is connected to the second word line, and applies a read voltage within a range of a ground voltage (inclusive) to a power supply voltage (exclusive) to the second word line in reading data.

According to a second aspect of the present invention, there is provided a semiconductor memory device comprising:

a first inverter circuit and a second inverter circuit formed by transistors;

a first storage node connected to an output terminal of the first inverter circuit and an input terminal of the second inverter circuit;

a second storage node connected to an input terminal of the first inverter circuit and an output terminal of the second inverter circuit;

a first transfer gate which is connected between a first power node of the first inverter circuit and a first bit line, and formed by an N-type transistor;

a second transfer gate which is connected between a second power node of the second inverter circuit and a second bit line, and formed by an N-type transistor;

a first word line connected to gate terminals of the first transfer gate and the second transfer gate;

a first read transistor which is connected between the first power node and a second word line, and formed by a P-type transistor having a gate terminal connected to the second storage node;

a second read transistor which is connected between the second power node and the second word line, and formed by a P-type transistor having a gate terminal connected to the first storage node; and an application circuit which is connected to the second word line, and applies a read voltage within a range of a ground voltage (exclusive) to a power supply voltage (inclusive) to the second word line in reading data.

BRIEF DESCRIPTION OF THE SEVERAL VIEWS OF THE DRAWING

FIG. 4 is a circuit diagram illustrating a data hold operation of the memory cell MC;

FIG. 5 is a timing chart illustrating the data hold operation of the memory cell MC;

FIG. 12 is a circuit diagram illustrating a data write state operation of an unselected memory cell MC;

FIG. 13 is a circuit diagram mainly illustrating a memory cell MC of an SRAM according to the second embodiment of the present invention;

FIG. 14 is a circuit block diagram illustrating a voltage application circuit 18 shown in FIG. 13;

DETAILED DESCRIPTION OF THE INVENTION

Figure 1:
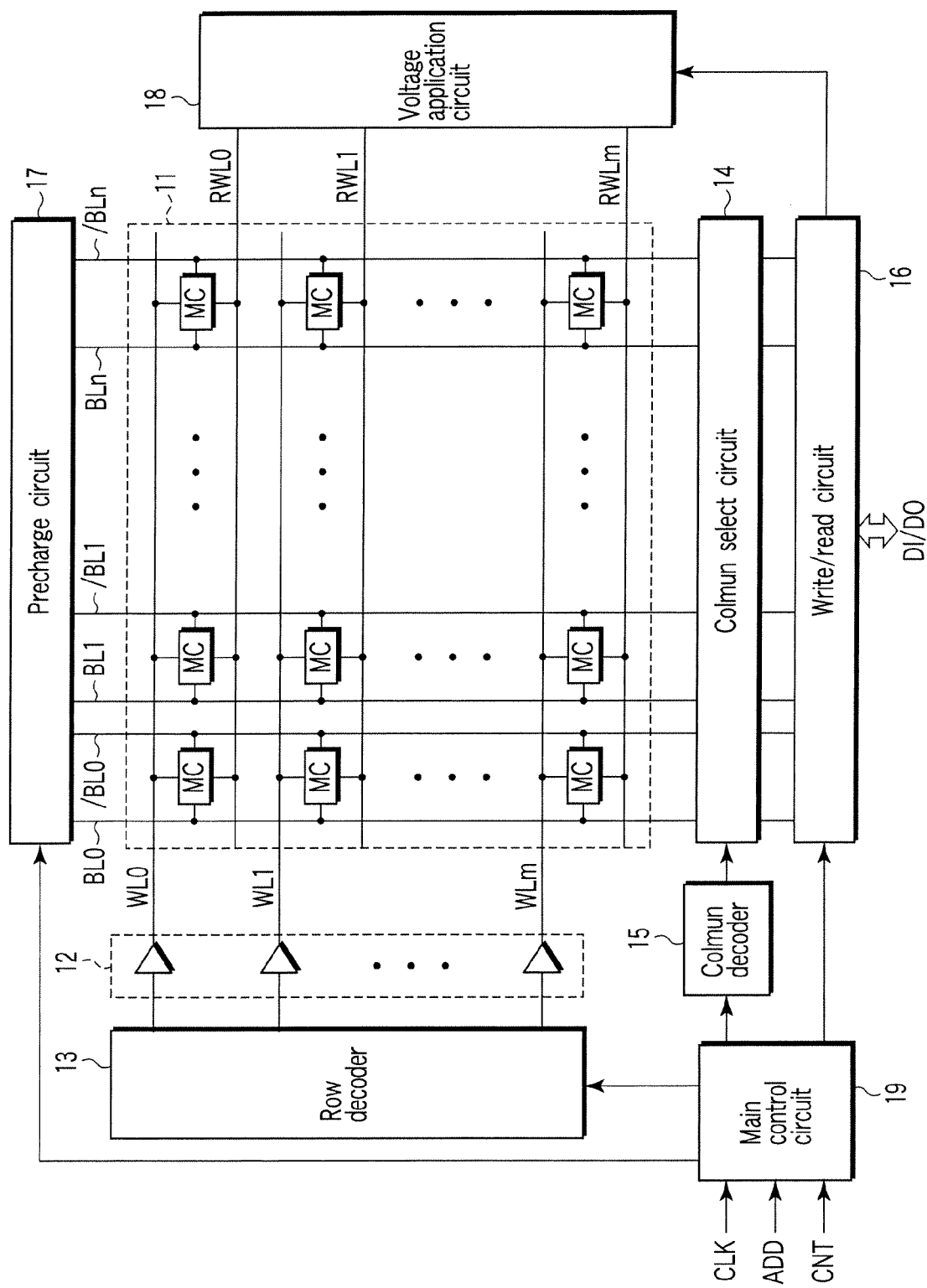
FIG. 1 is a block diagram illustrating the arrangement of an SRAM according to the first embodiment of the present invention.

Embodiments of the present invention will be described below with reference to the accompanying drawing. The same reference numerals denote elements having the same functions and arrangements throughout the following description, and a repetitive description thereof will be made only when necessary.

First Embodiment

FIG. 1 is a block diagram illustrating the arrangement of an SRAM according to the first embodiment of the present invention. The SRAM comprises a memory cell array 11 formed of a plurality of static memory cells MC. The memory cell array 11 has a plurality of word lines WL0 to WLm which run in the row direction. The memory cell array 11 has a plurality of read word lines RWL0 to RWLm which run in the row direction.

The memory cell array 11 has a plurality of pairs of bit lines BL0 and /BL0 to BLn and /BLn which run in the column direction. The word line WL selects a row in the memory cell array 11. The pair of bit lines BL and /BL select a column in the memory cell array 11.

A row decoder 13 connects to the plurality of word lines WL via a word line driver circuit 12. The row decoder 13 selects a corresponding word line WL on the basis of a row address signal.

A column select circuit 14 connects to the plurality of pairs of bit lines BL and /BL via a sense amplifier circuit (not shown) for detecting/amplifying data. A column decoder 15 connects to the column select circuit 14. The column decoder 15 supplies a column select signal to the column select circuit 14 on the basis of a column address signal. The column select circuit 14 selects a corresponding pair of bit lines BL and /BL on the basis of the column select signal.

A read/write circuit 16 connects to the column select circuit 14. The read/write circuit 16 reads/writes data from/to the column selected by the column select circuit 14. That is, the read/write circuit 16 writes data DI input from an external circuit to the memory cell array 11 as write data. In addition, the read/write circuit 16 outputs the data read from the memory cell array 11 to the external circuit as output data DO.

A precharge circuit 17 precharges the pair of bit lines BL and /BL to a high-level voltage (e.g., power supply voltage Vdd) before read and write operations. For example, the precharge circuit 17 executes a precharge operation on the basis of a precharge signal supplied from a main control circuit 19. The precharge circuit 17 precharges the pair of bit lines BL and /BL when the precharge signal is asserted, while it cancels precharging when the precharge signal is negated.

A voltage application circuit 18 applies a read voltage to the read word line RWL while reading data. The arrangement and operation of the voltage application circuit 18 will be described later.

The main control circuit 19 controls the circuits in the SRAM. The main control circuit 19 receives, e.g., a clock signal CLK, address signal ADD, and control signal CNT from an external circuit. On the basis of the address signal ADD, the main control circuit 19 generates a row address signal to be supplied to the row decoder 13 and a column address signal to be supplied to the column decoder 15. The main control circuit 19 controls, e.g., the precharge, write, and read operations on the basis of, e.g., the control signal CNT.

Figure 2:
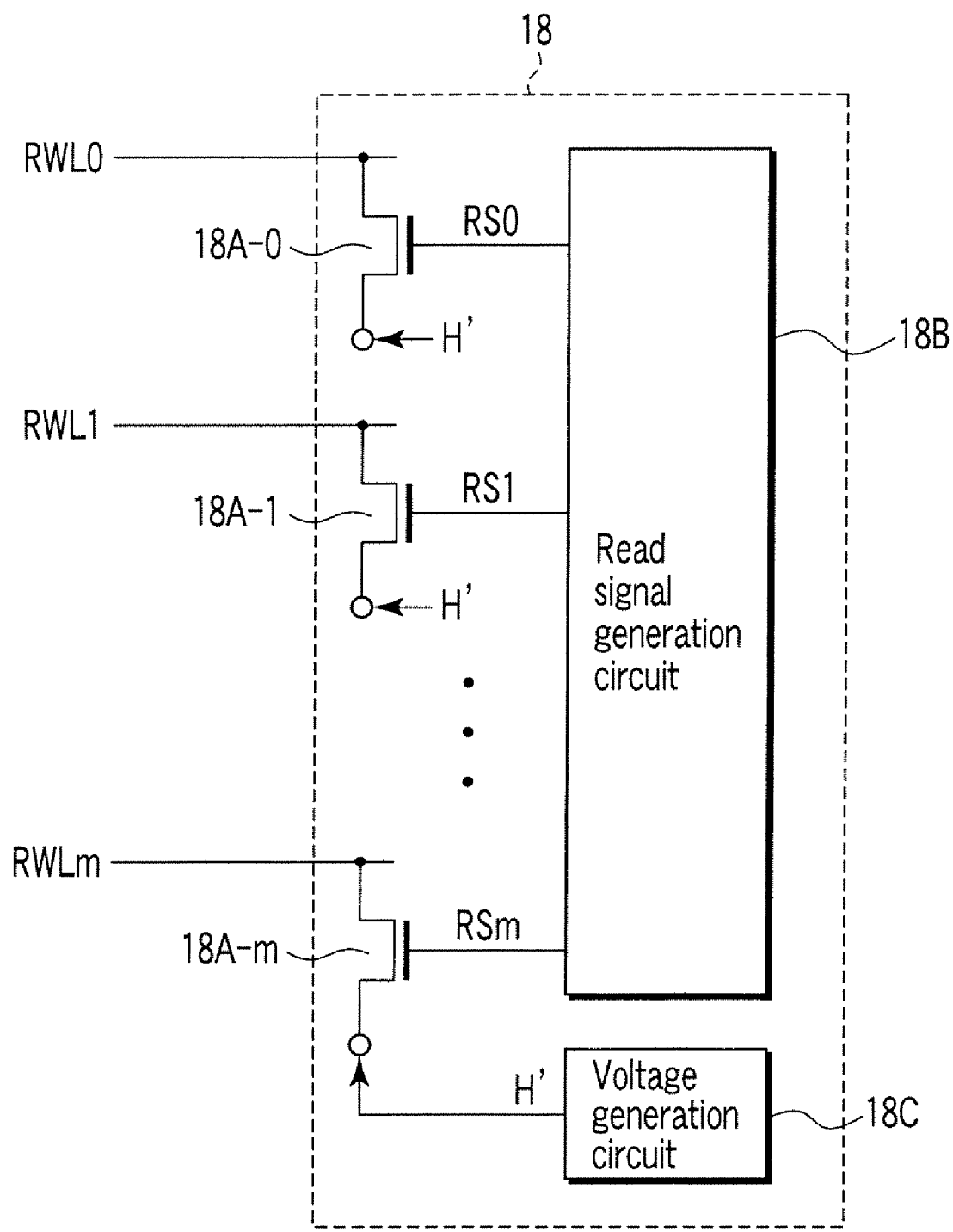
FIG. 2 is a circuit block diagram illustrating a voltage application circuit 18 shown in FIG. 1.

FIG. 2 is a circuit block diagram illustrating the voltage application circuit 18 shown in FIG. 1. The voltage application circuit 18 comprises a plurality of read NMOS transistors 18A-0 to 18A-m arranged in one-to-one correspondence with the plurality of read word lines RWL0 to RWLm, a read signal generation circuit 18B, and a voltage generation circuit 18C.

The drain terminal of the NMOS transistor 18A connects to the read word line RWL. The source terminal of the NMOS transistor 18A connects to the voltage generation circuit 18C. The gate terminal of the NMOS transistor 18A connects to the read signal generation circuit 18B.

The read signal generation circuit 18B generates read signals RS0 to RSm which are activated (set at high level) at the data read time and deactivated during the time (including the data write time and data hold time) other than the data read time. The read signal generation circuit 18B generates the read signals RS0 to RSm on the basis of a control signal supplied from the main control circuit 19. The main control circuit 19 generates this control signal on the basis of a read command. The read signals RS0 to RSm are supplied to the gate terminals of the NMOS transistors 18A-0 to 18A-m, respectively.

The voltage generation circuit 18C generates a read voltage H'. The read voltage H' is set within the range of a ground voltage Vss (inclusive) to the power supply voltage Vdd (exclusive). The read voltage H' is preferably set to the ground voltage Vss. The read voltage H' is applied to the source terminal of each NMOS transistor 18A.

Figure 3:
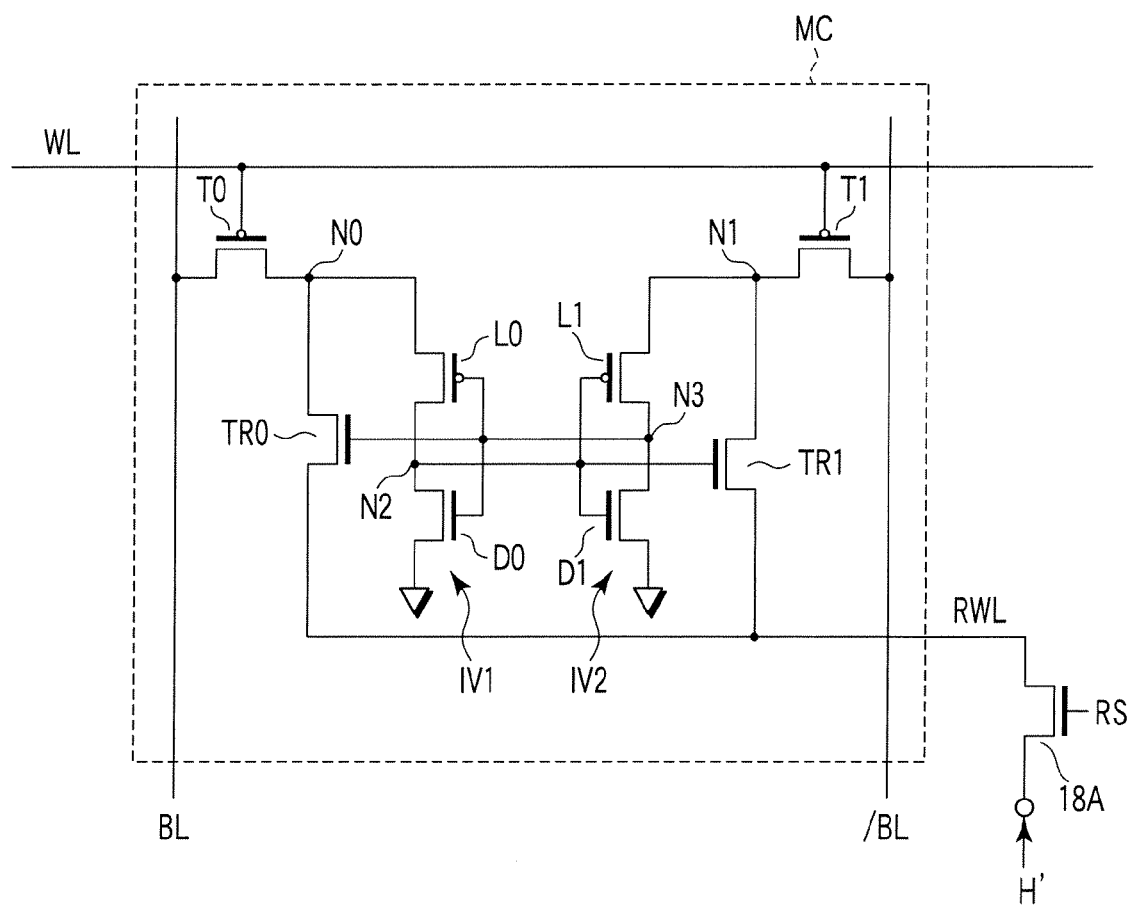
FIG. 3 is a circuit diagram illustrating a memory cell MC shown in FIG. 1.

FIG. 3 is a circuit diagram illustrating the memory cell MC shown in FIG. 1. The memory cell MC is an 8Tr. SRAM cell including eight MOS transistors.

The memory cell MC comprises first and second inverter circuits IV1 and IV2. The first inverter circuit IV1 includes a load PMOS transistor L0 and drive NMOS transistor D0. The PMOS and NMOS transistors L0 and D0 are connected in series with each other between a power node N0 and the ground voltage Vss (e.g., a ground terminal which receives the ground voltage Vss).

The second inverter circuit IV2 includes a load PMOS transistor L1 and drive NMOS transistor D1. The PMOS and NMOS transistors L1 and D1 are connected in series with each other between a power node N1 and the ground terminal.

More specifically, the source terminal of the PMOS transistor L0 connects to the power node N0. The drain terminal of the PMOS transistor L0 connects to the drain terminal of the NMOS transistor D0 via a storage node N2. The gate terminal of the PMOS transistor L0 connects to the gate terminal of the NMOS transistor D0. The source terminal of the NMOS transistor D0 connects to the ground terminal.

The source terminal of the PMOS transistor L1 connects to the power node N1. The drain terminal of the PMOS transistor L1 connects to the drain terminal of the NMOS transistor D1 via a storage node N3. The gate terminal of the PMOS transistor L1 connects to the gate terminal of the NMOS transistor D1. The source terminal of the NMOS transistor D1 connects to the ground terminal.

The gate terminal of the PMOS transistor L0 connects to the storage node N3. The gate terminal of the PMOS transistor L1 connects to the storage node N2. In other words, the output terminal of the first inverter circuit IV1 connects to the input terminal of the second inverter circuit IV2, while the output terminal of the second inverter circuit IV2 connects to the input terminal of the first inverter circuit IV1.

The power node N0 connects to the bit line BL via a transfer gate T0 formed by, e.g., a PMOS transistor. The gate terminal of the transfer gate T0 connects to the word line WL.

The power node N1 connects to the bit line /BL via a transfer gate T1 formed by, e.g., a PMOS transistor. The gate terminal of the transfer gate T1 connects to the word line WL.

The threshold voltages of the transfer gates T0 and T1 are so set as to generate leakage currents (off-leakage currents) upon off-state. More specifically, the threshold voltages of the transfer gates T0 and T1 are set such that the pair of bit lines BL and /BL have the same voltages as those of the power nodes N0 and N1 by their off-leakage currents.

For example, the threshold voltages of the transfer gates T0 and T1 are set lower than those of PMOS transistors in their peripheral circuits. In general, the threshold voltages of the PMOS transistors in the peripheral circuits are so set as to prevent generation of off-leakage currents as much as possible (or minimize off-leakage currents). Especially, it is necessary to minimize off-leakage currents because the PMOS transistors L0 and L1 included in the first and second inverter circuits IV1 and IV2 must hold data.

For example, the threshold voltages of the transfer gates T0 and T1 are set lower than those of the PMOS transistors L0 and L1 included in the first and second inverter circuits IV1 and IV2. More specifically, to set the threshold voltages of the transfer gates T0 and T1 low, the gate lengths (channel lengths) of the transfer gates T0 and T1 are set shorter than those of the PMOS transistors L0 and L1.

The storage node N3 connects to the gate terminal of a read NMOS transistor TR0. The drain terminal of the NMOS transistor TR0 connects to the power node N0. The source terminal of the NMOS transistor TR0 connects to the read word line RWL.

The storage node N2 connects to the gate terminal of a read NMOS transistor TR1. The drain terminal of the NMOS transistor TR1 connects to the power node N1. The source terminal of the NMOS transistor TR1 connects to the read word line RWL.

The operation of the SRAM having the above-described arrangement will be described. The memory cell MC changes between four states, i.e., (a) data hold state, (b) data read state, (c) data write state (selected memory cell), and (d) data write state (unselected memory cell). The selected memory cell is a memory cell selected by a word line WL and a pair of bit lines BL and /BL. The unselected memory cell is a memory cell which is connected to an activated word line WL (selected word line WL) and is not selected by a pair of bit lines BL and /BL.

The data hold operation of a memory cell MC will be explained first. FIG. 4 is a circuit diagram illustrating the data hold operation of the memory cell MC. FIG. 5 is a timing chart illustrating the data hold operation of the memory cell MC.

During no operation (NOP), the memory cell MC holds written data. The NOP indicates, e.g., the state (i.e., the state in which all the word lines WL0 to WLm are deactivated) in which the memory cell array 11 is not accessed, or the operation state of the memory cell MC connected to a deactivated word line WL.

In the data hold state, the read signal generation circuit 18B deactivates (negates) the read signal RS (sets it at low level) while the read NMOS transistor 18A is off. Current paths which respectively connect the power nodes N0 and N1 in the inverter circuits to the terminals which receive the read voltages H' are not directly involved in holding data. Referring to FIG. 4, a broken line indicates a current path that is not directly involved in holding data.

Also in the data hold state, a precharge signal to be supplied from the main control circuit 19 to the precharge circuit 17 is activated (asserted). The precharge circuit 17 applies high-level voltages to the pair of bit lines BL and /BL. This precharge operation sets the pair of bit lines BL and /BL at high-voltages. As the word line WL is deactivated (set at high level), both the transfer gates T0 and T1 are off.

The threshold voltages of the transfer gates T0 and T1 are set lower than those of the PMOS transistors L0 and L1 included in the first and second inverter circuits IV1 and IV2. Off-leakage currents Ioff-p of the transfer gates T0 and T1 set the power nodes N0 and N1 at high-level voltages that are the same as those of the pair of bit lines BL and /BL. At this time, the first and second inverter circuits IV1 and IV2 perform a latch operation to hold data in the storage nodes N2 and N3. FIG. 4 exemplifies a case in which the storage node N2 holds high data while the storage node N3 holds low data.

Figure 6:
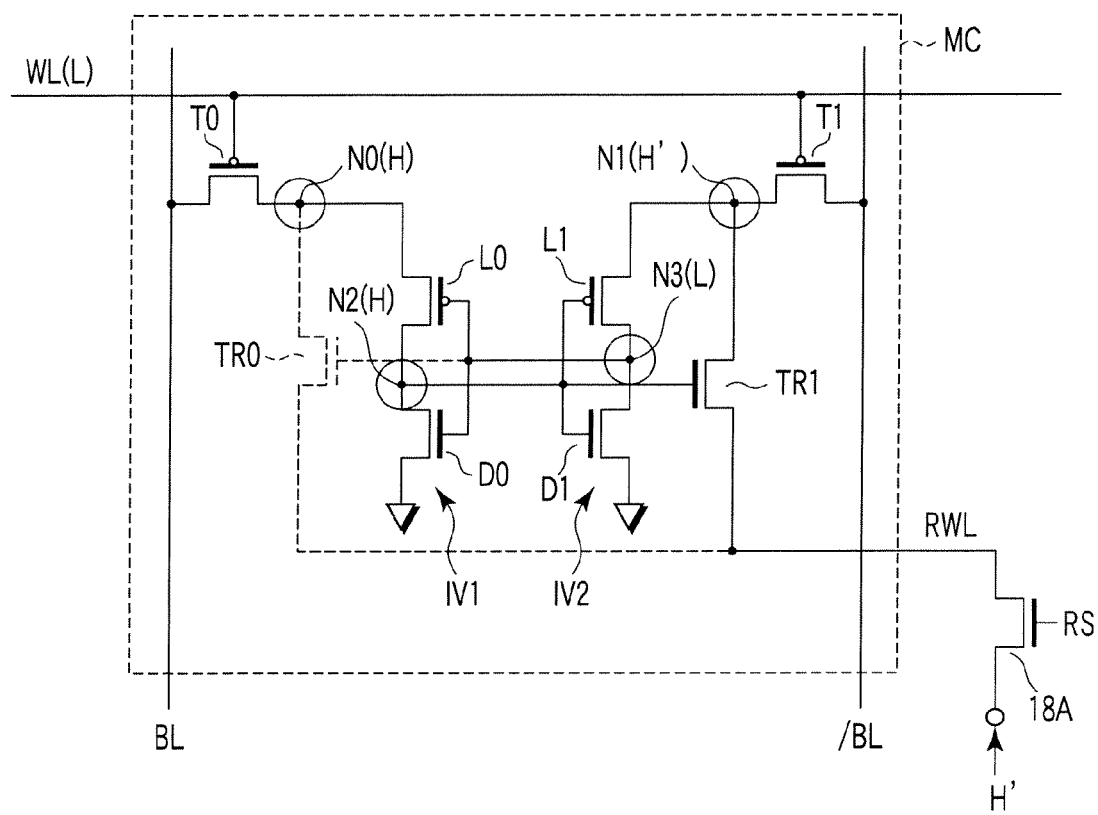
FIG. 6 is a circuit diagram illustrating a data read operation of the memory cell MC.
Figure 7:
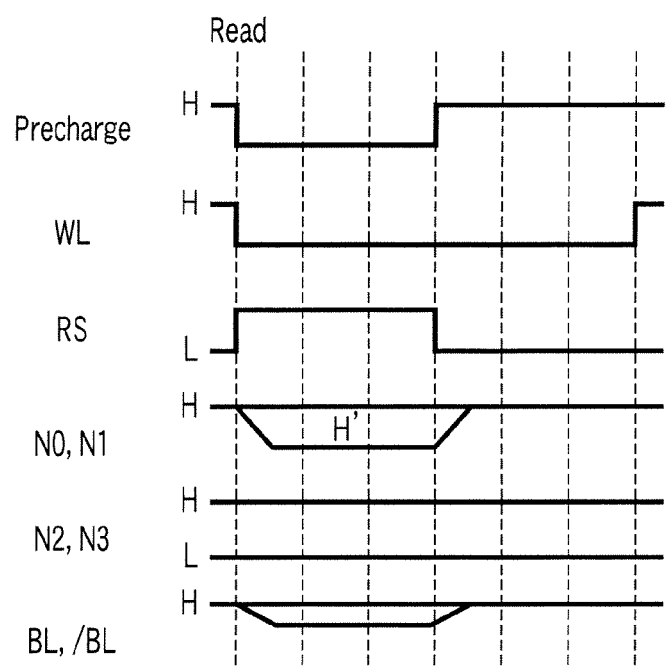
FIG. 7 is a timing chart illustrating the data read operation of the memory cell MC.

The data read operation of a memory cell MC will be explained next. FIG. 6 is a circuit diagram illustrating the data read operation of the memory cell MC. FIG. 7 is a timing chart illustrating the data read operation of the memory cell MC. The conditions of a selected memory cell and unselected memory cell in the data read state are different in whether a corresponding pair of bit lines BL and /BL are precharged (unselected memory cell) or their precharging is cancelled (selected memory cell).

In the data read state, the power node N0 in the first inverter circuit IV1 having the storage node N2 holding the high data is not directly involved in reading data because the NMOS transistor TR0 is turned off. Referring to FIG. 6, a broken line indicates a current path that is not directly involved in reading data.

The characteristic feature of the SRAM having the arrangement shown in FIG. 6 is that a plurality of memory cells MC connected to a selected word line are not disturbed. In the conventional 6Tr. SRAM cell, a storage node holding low data connects to a precharged bit line via a transfer gate. For this reason, a plurality of memory cells connected to a selected word line are disturbed. In contrast, the 8Tr. SRAM cell shown in FIG. 6 is not disturbed because the PMOS transistor L1, which is off, is placed between the bit line /BL and the storage node N3 holding the low data.

In the data read state, the read signal generation circuit 18B activates the read signal RS (sets it at high level), while it activates the word line WL (sets it at low level). As the read signal RS goes high, the two NMOS transistors TR1 and 18A connected in series with each other drop the voltage of the power node N1 in the second inverter circuit IV2 having the storage node N3 holding the low data to the read voltage H'.

Figure 8:
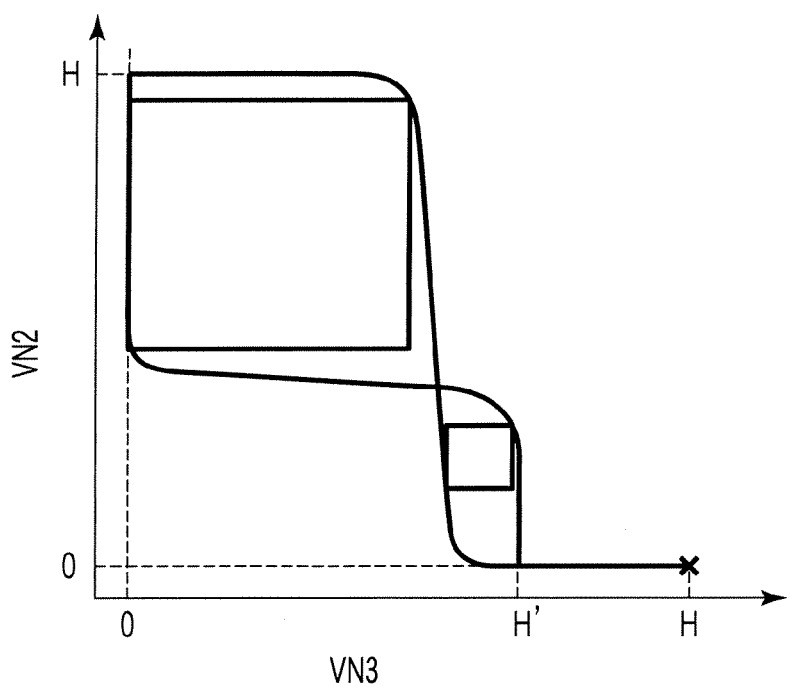
FIG. 8 is a graph illustrating a spectacle characteristic when a storage node N2 holds high data.

FIG. 8 is a graph illustrating a spectacle characteristic when the storage node N2 holds the high data. The spectacle characteristic is a result obtained upon superimposing the input/output characteristics of the first and second inverter circuits IV1 and IV2. The word line WL is activated (set at low level) while the pair of bit lines BL and /BL are precharged to a high-level voltage.

Referring to FIG. 8, the abscissa indicates a voltage $V_{N3}$ of the storage node N3, and the ordinate indicates a voltage $V_{N2}$ of the storage node N2. The storage node N2 corresponds to the output of the first inverter circuit IV1 and to the input of the second inverter circuit IV2. The storage node N3 corresponds to the input of the first inverter circuit IV1 and to the output of the second inverter circuit IV2.

The length of one side of a maximum square inscribed in each of two areas surrounded by two curves is defined as a static noise margin (SNM). The SNM serves as an index representing the stability of stored data. In general, as the SNM increases, the stability of data stored in an SRAM cell increases and therefore data destruction due to power supply voltage noise in the chip is less likely to occur. Hence, it is important to form a large SNM from the viewpoint of designing an SRAM cell.

As shown in FIG. 8, the high data hold side exhibits a larger SNM, i.e., a higher data hold stability. The voltage of the power node N1 in the second inverter circuit IV2 continues to drop while the word line WL is activated. This further increases the data hold stability.

Figure 9:
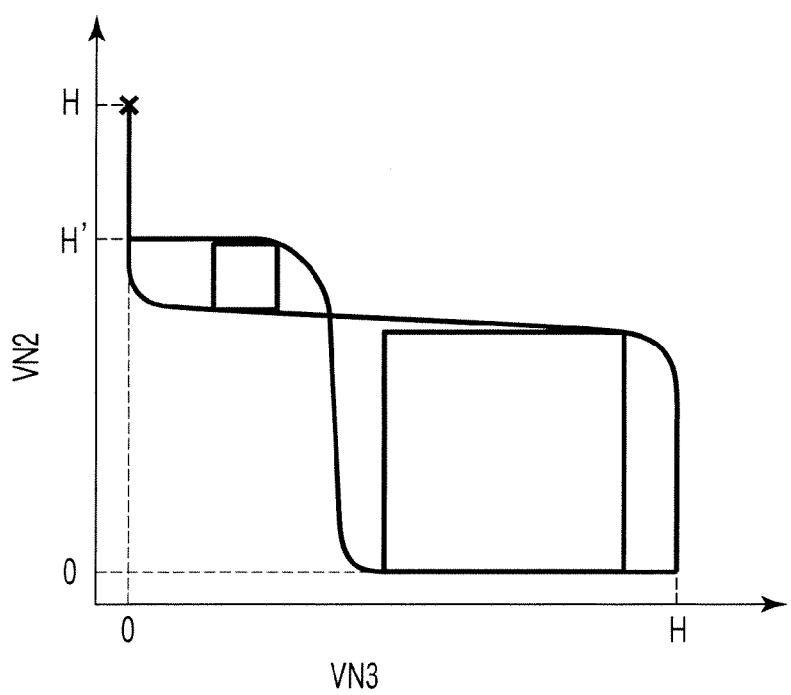
FIG. 9 is a graph illustrating a spectacle characteristic when the storage node N2 holds low data.

FIG. 9 is a graph illustrating a spectacle characteristic when the storage node N2 holds low data. As shown in FIG. 9, the low data hold side exhibits a larger SNM, i.e., a higher data hold stability.

As shown in FIG. 7, after reading the data from the memory cell MC, the read signal RS is deactivated (set at low level). At the same time, the precharging of the pair of bit lines BL and /BL starts. Then, the power nodes N0 and N1 change to high-level voltages to deactivate the word line WL (set it at high level).

Figure 10:
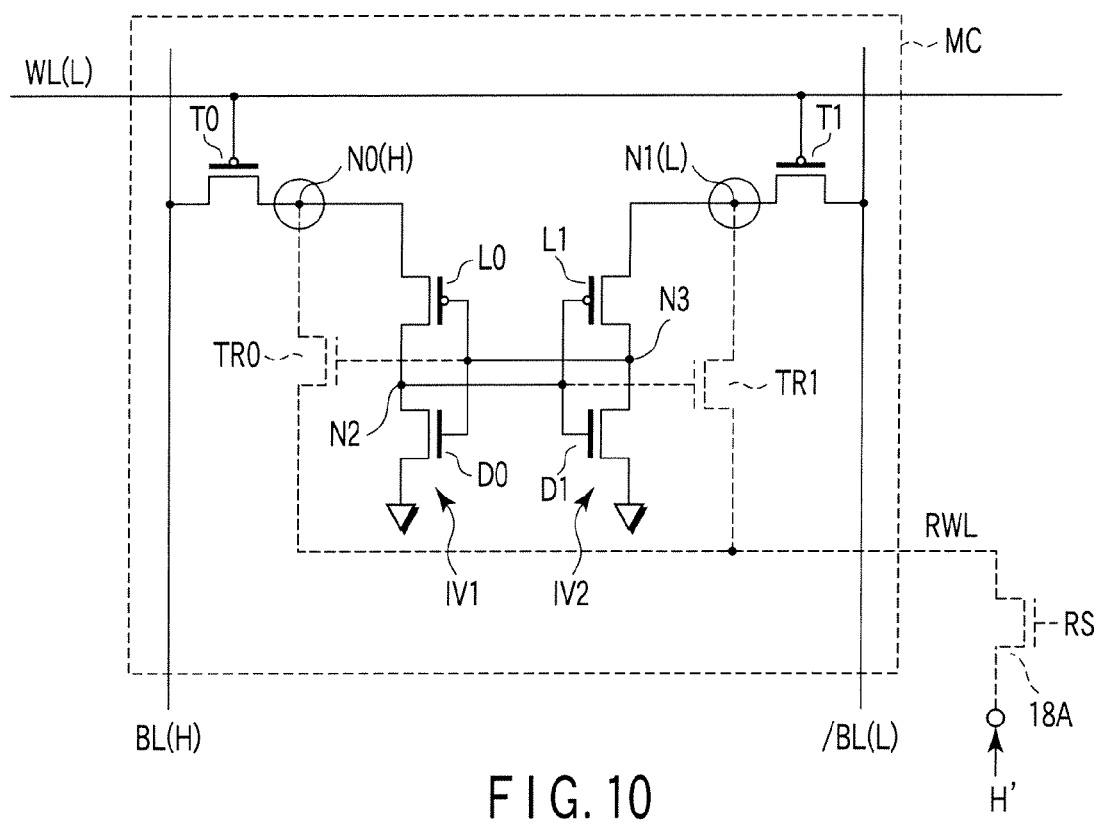
FIG. 10 is a circuit diagram illustrating a data write operation of a selected memory cell MC.
Figure 11:
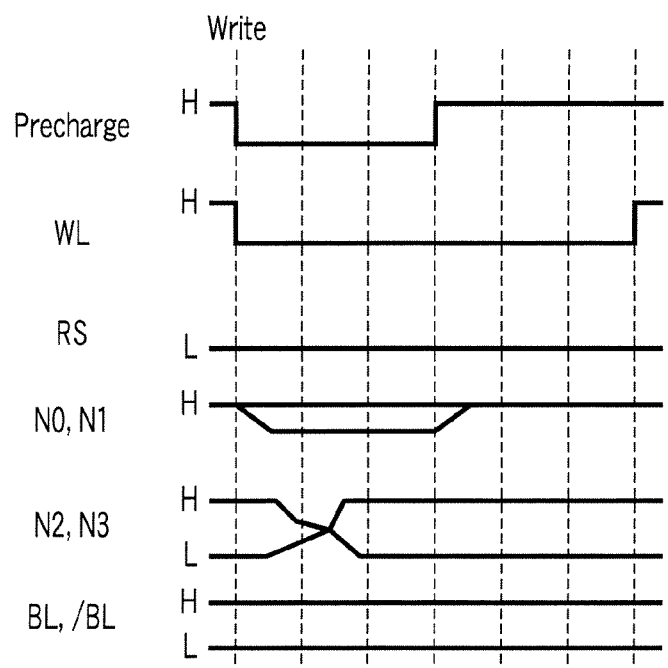
FIG. 11 is a timing chart illustrating the data write operation of the selected memory cell MC.

The data write operation of a selected memory cell MC will be explained next. FIG. 10 is a circuit diagram illustrating the data write operation of the selected memory cell MC. FIG. 11 is a timing chart illustrating the data write operation of the selected memory cell MC.

In the data write state, the read signal generation circuit 18B deactivates the read signal RS (sets it at low level) while the read NMOS transistor 18A is off. Current paths which respectively connect the power nodes N0 and N1 in the inverter circuits to the terminals which receive the read voltages H' are not directly involved in writing data. Referring to FIG. 10, a broken line indicates a current path that is not directly involved in writing data.

Also in the data write state, a precharge signal to be supplied from the main control circuit 19 to the precharge circuit 17 is activated to cancel the precharging of the pair of bit lines BL and /BL.

Write data is set in the pair of bit lines BL and /BL to activate the word line WL (set it at low level). At this time, the voltage of the power node N1 in the second inverter circuit IV2 including the storage node N3 in which low data is to be written drops to the threshold voltage of the transfer gate T1. To the contrary, the power node N0 in the first inverter circuit IV1 including the storage node N2 in which high data is to be written changes to a high-level voltage.

Since the transfer gates T0 and T1 are formed by PMOS transistors, the voltages of the power nodes N0 and N1 may not sufficiently drop to result in failure in writing data. However, since the threshold voltages of the transfer gates T0 and T1 are set lower than those of the PMOS transistors L0 and L1 of the first and second inverter circuits IV1 and IV2, it is possible to write data.

The threshold voltages of the inverter circuits IV1 and IV2 are set even on the basis of low-level potentials set to the power nodes N0 and N1 to allow data to be written. For example, the threshold voltages of the inverter circuits IV1 and IV2 are set lower than Vdd/2.

To write data to the memory cell MC, it is necessary to turn off the drive NMOS transistor D0 earlier than the load PMOS transistor L1. For this purpose, the threshold voltages of the inverter circuits IV1 and IV2 are set such that the drive NMOS transistor D0 is turned off earlier than the load PMOS transistor L1 in the data write state (while held data is inverted). It is possible to adjust the threshold voltage of the inverter circuit by changing the ratio of current drive force between the NMOS and PMOS transistors in the inverter circuit. Setting the threshold voltages of the inverter circuits IV1 and IV2 as described above makes it easier to write data.

After writing the data, the pair of bit lines BL and /BL are precharged. The pair of bit lines BL and /BL change to high-level voltages. Then, the word line WL is deactivated (set at high level) to turn off the transfer gates T0 and T1.

The operation of an unselected memory cell MC in the data write state will be explained next. FIG. 12 is a circuit diagram illustrating the data write operation of the unselected memory cell MC.

In the data write state, the read signal generation circuit 18B deactivates the read signal RS (sets it at low level) while the read NMOS transistor 18A is off. Current paths which respectively connect the power nodes N0 and N1 in the inverter circuits to the terminals which receive the read voltages H' are not directly involved in writing data. Referring to FIG. 12, a broken line indicates a current path that is not directly involved in writing data.

In the unselected memory cell MC in the data write state, a precharge signal to be supplied from the main control circuit 19 to the precharge circuit 17 is activated. The precharge circuit 17 applies high-level voltages to the pair of bit lines BL and /BL. This precharge operation sets the pair of bit lines BL and /BL at high-voltages.

As the word line WL is activated (set at low level), the transfer gates T0 and T1 are turned on. This sets the power nodes N0 and N1 at high-level voltages. The two inverter circuits IV1 and IV2 perform a latch operation to hold data in the storage nodes N2 and N3.

In the conventional 6Tr. SRAM cell, an unselected memory cell connected to a selected word line is disturbed because a storage node holding low data connects to a bit line precharged to high level via a transfer gate. To the contrary, in the 8Tr. SRAM cell shown in FIG. 12, the bit line /BL precharged to a high-level voltage is not electrically connected to the storage node N3 holding the low data because the PMOS transistor L1 is turned off. Hence, the unselected memory cell MC is not disturbed.

According to the first embodiment described in detail above, it is possible to prevent any disturbance from acting on a memory cell MC (unselected memory cell MC) which is connected to an activated word line WL and to a precharged pair of bit lines BL and /BL.

It is also possible to improve static noise margins on the high and low data hold sides in the data read state. This allows an improvement in holding data stability. Hence, the SRAM according to the first embodiment can satisfactorily cope with a variation in threshold voltage and a drop in power supply voltage along with microfabrication.

Second Embodiment

The second embodiment forms an SRAM by connecting, via a transfer gate, a bit line and a low-potential side power node in an inverter circuit of a memory cell MC. FIG. 13 is a circuit diagram mainly illustrating the memory cell MC of the SRAM according to the second embodiment of the present invention.

The memory cell MC comprises first and second inverter circuits IV1 and IV2. The first inverter circuit IV1 includes a drive PMOS transistor D0 and load NMOS transistor L0. The PMOS transistor D0 and NMOS transistor L0 are connected in series with each other between a power node N0 and a power supply voltage Vdd (e.g., a power supply voltage terminal which receives the power supply voltage Vdd).

The second inverter circuit IV2 includes a drive PMOS transistor D1 and load NMOS transistor L1. The PMOS transistor D1 and NMOS transistor L1 are connected in series with each other between the power supply voltage terminal and a power node N1.

More specifically, the source terminal of the PMOS transistor D0 connects to the power supply voltage terminal. The drain terminal of the PMOS transistor D0 connects to the drain terminal of the NMOS transistor L0 via a storage node N2. The gate terminal of the PMOS transistor D0 connects to the gate terminal of the NMOS transistor L0. The source terminal of the NMOS transistor L0 connects to the power node N0.

The source terminal of the PMOS transistor D1 connects to the power supply voltage terminal. The drain terminal of the PMOS transistor D1 connects to the drain terminal of the NMOS transistor L1 via a storage node N3. The gate terminal of the PMOS transistor D1 connects to the gate terminal of the NMOS transistor L1. The source terminal of the NMOS transistor L1 connects to the power node N1.

The gate terminal of the PMOS transistor D0 connects to the storage node N3. The gate terminal of the PMOS transistor D1 connects to the storage node N2. In other words, the output terminal of the first inverter circuit IV1 connects to the input terminal of is the second inverter circuit IV2, while the output terminal of the second inverter circuit IV2 connects to the input terminal of the first inverter circuit IV1.

The power node N0 connects to a bit line BL via a transfer gate T0 formed by, e.g., NMOS transistor. The gate terminal of the transfer gate T0 connects to a word line WL.

The power node N1 connects to a bit line /BL via a transfer gate T1 formed by, e.g., NMOS transistor. The gate terminal of the transfer gate T1 connects to the word line WL.

The threshold voltages of the transfer gates T0 and T1 are so set as to generate leakage currents (off-leakage currents) upon off-state. More specifically, the threshold voltages of the transfer gates T0 and T1 are set such that the pair of bit lines BL and /BL have the same voltages as those of the power nodes N0 and N1 by their off-leakage currents. For example, the threshold voltages of the transfer gates T0 and T1 are set lower than those of the NMOS transistors L0 and L1 included in the first and second inverter circuits IV1 and IV2. More specifically, to set the threshold voltages of the transfer gates T0 and T1 low, the gate lengths (channel lengths) of the transfer gates T0 and T1 are set shorter than those of the NMOS transistors L0 and L1.

The storage node N3 connects to the gate terminal of a read PMOS transistor TR0. The drain terminal of the PMOS transistor TR0 connects to the power node N0. The source terminal of the PMOS transistor TR0 connects to a read word line RWL.

The storage node N2 connects to the gate terminal of a read PMOS transistor TR1. The drain terminal of the PMOS transistor TR1 connects to the power node N1. The source terminal of the PMOS transistor TR1 connects to the read word line RWL.

The read word line RWL connects to a voltage application circuit 18. FIG. 14 is a circuit block diagram illustrating the voltage application circuit 18. The voltage application circuit 18 comprises a read PMOS transistor 18A corresponding to the read word line RWL, read signal generation circuit 18B, and voltage generation circuit 18C.

The drain terminal of the PMOS transistor 18A connects to the read word line RWL. The source terminal of the PMOS transistor 18A connects to the voltage generation circuit 18C. The read signal generation circuit 18B supplies a read signal RS to the gate terminal of the PMOS transistor 18A. The read signal RS is activated (set at low level) at the data read time and deactivated during the time (including the data write time and data hold time) other than the data read time.

The voltage generation circuit 18C applies a read voltage H' to the source terminal of the PMOS transistor 18A. The read voltage H' is set within the range of a ground voltage Vss (exclusive) to the power supply voltage Vdd (inclusive). The read voltage H' is preferably set to the power supply voltage Vdd.

Figure 15:
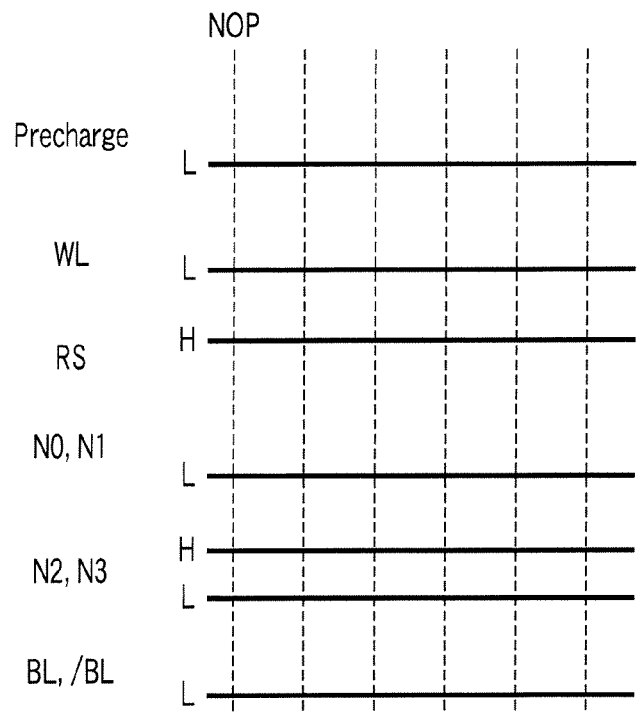
FIG. 15 is a timing chart illustrating the data hold operation of a memory cell MC.

The operation of the SRAM having the above-described arrangement will be described. The data hold operation of a memory cell MC will be explained first. FIG. 15 is a timing chart illustrating the data hold operation of the memory cell MC.

In the data hold state, the read signal generation circuit 18B deactivates the read signal RS (sets it at high level) while the read PMOS transistor 18A is off. A precharge signal to be supplied from a main control circuit 19 to a precharge circuit 17 is activated. The precharge circuit 17 applies low-level voltages (ground voltages Vss) to the pair of bit lines BL and /BL. This precharge operation sets the pair of bit lines BL and /BL at low-level voltages. The word line WL is deactivated (set at low level). As the word line WL is low level, both the transfer gates T0 and T1 are off.

The threshold voltages of the transfer gates T0 and T1 are set lower than those of the NMOS transistors L0 and L1 included in the first and second inverter circuits IV1 and IV2. Off-leakage currents Ioff-p of the transfer gates T0 and T1 set the power nodes N0 and N1 at low-level voltages that are the same as those of the pair of bit lines BL and /BL. At this time, the first and second inverter circuits IV1 and IV2 perform a latch operation to hold data in the storage nodes N2 and N3.

Figure 16:
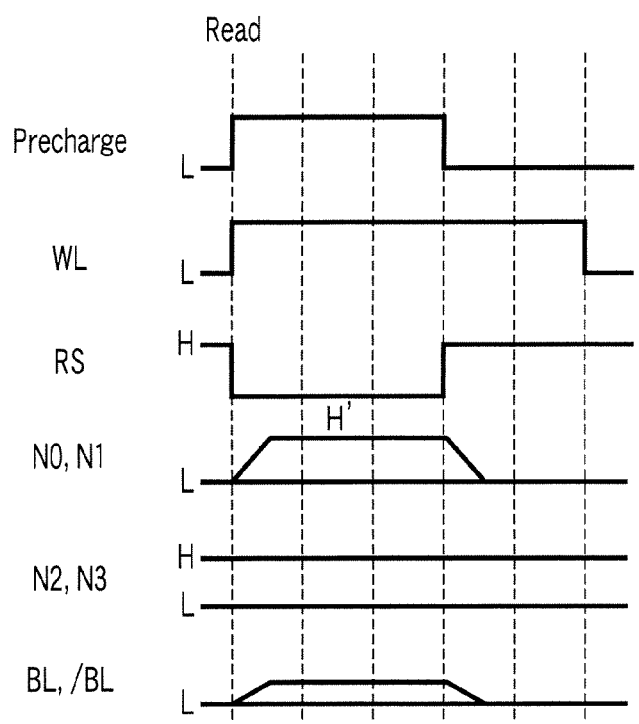
FIG. 16 is a timing chart illustrating the data read operation of the memory cell MC.

The data read operation of a memory cell MC will be explained next. FIG. 16 is a timing chart illustrating the data read operation of the memory cell MC.

In the data read state, the read signal generation circuit 18B activates the read signal RS (sets it at low level), while it activates the word line WL (sets it at high level). By making the read signal RS low, the two read PMOS transistors connected in series with each other raises the voltage of the power node in the inverter circuit having a storage node holding high data to the read voltage H'. At this time, the memory cell MC is not disturbed because the load NMOS transistor, which is off, is placed between the bit line and the storage node holding the high data.

After reading the data from the memory cell MC, the read signal RS is deactivated (set at high level). At the same time, the precharging of the bit line starts. Then, the power nodes N0 and N1 change to high-level voltages to deactivate the word line WL (set it at low level).

Figure 17:
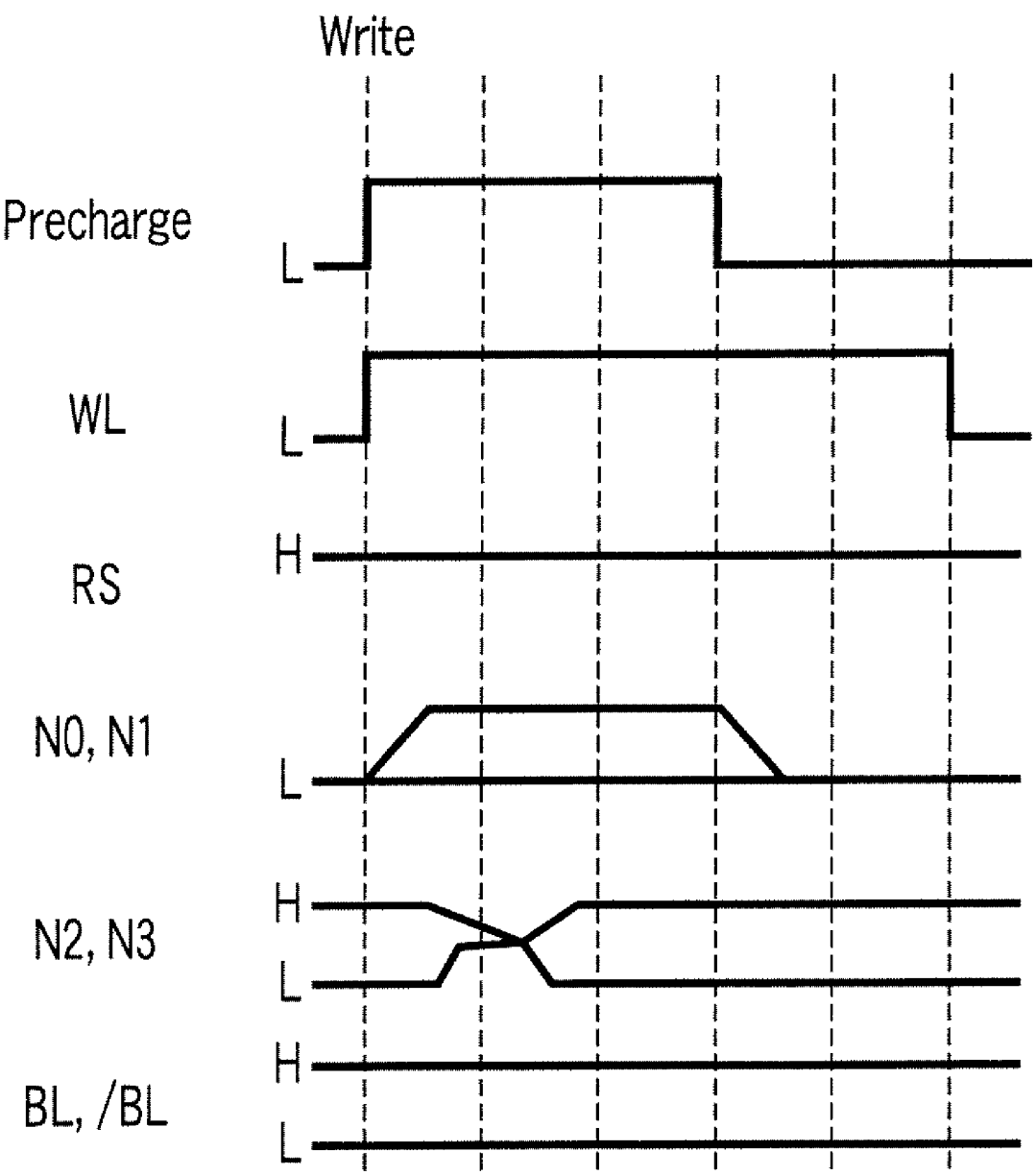
FIG. 17 is a timing chart illustrating the data write operation of a selected memory cell MC.

The data write operation of a selected memory cell MC will be explained next. FIG. 17 is a timing chart illustrating the data write operation of the selected memory cell MC.

In the data write state, the read signal generation circuit 18B deactivates the read signal RS (sets it at high level) while the read PMOS transistor 18A is off. A precharge signal to be supplied from the main control circuit 19 to the precharge circuit 17 is deactivated to cancel the precharging of the pair of bit lines BL and /BL.

Write data is set in the pair of bit lines BL and /BL to activate the word line WL (set it at high level). With this operation, the write data is written to the memory cell MC. After writing the data, the pair of bit lines BL and /BL are precharged to low-level voltages. The pair of bit lines BL and /BL change to low-level voltages. Then, the word line WL is deactivated (set at low level) to turn off the transfer gates T0 and T1.

The operation of an unselected memory cell MC in the data write state will be explained next. In the unselected memory cell MC in the data write state, a precharge signal to be supplied from the main control circuit 19 to the precharge circuit 17 is activated. The precharge circuit 17 applies low-level voltages to the pair of bit lines BL and /BL. This precharge operation sets the pair of bit lines BL and /BL at low-level voltages.

As the word line WL is activated (set at high level), the transfer gates T0 and T1 are turned on. This sets the power nodes N0 and N1 at low-level voltages. The two inverter circuits IV1 and IV2 perform a latch operation to hold data in the storage nodes N2 and N3.

The bit line precharged to a high-level voltage is not electrically connected to the storage node holding the high data because the load NMOS transistor L1 between them is turned off. For this reason, the unselected memory cell MC is not disturbed.

According to the second embodiment as described in detail above, an SRAM is formed by connecting a low-potential side power node in an inverter circuit of a memory cell MC. Even in this case, it is possible to prevent any disturbance from acting on an unselected memory cell MC connected to an activated word line WL. Other effects are the same as those in the first embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a first inverter circuit and a second inverter circuit formed by transistors;
    a first storage node connected to an output terminal of the first inverter circuit and an input terminal of the second inverter circuit;
    a second storage node connected to an input terminal of the first inverter circuit and an output terminal of the second inverter circuit;
    a first transfer gate which is connected between a first power node of the first inverter circuit and a first bit line, and formed by a P-type transistor;
    a second transfer gate which is connected between a second power node of the second inverter circuit and a second bit line, and formed by a P-type transistor;
    a first word line connected to gate terminals of the first transfer gate and the second transfer gate;
    a first read transistor which is connected between the first power node and a second word line, and formed by an N-type transistor having a gate terminal connected to the second storage node;
    a second read transistor which is connected between the second power node and the second word line, and formed by an N-type transistor having a gate terminal connected to the first storage node; and
    an application circuit which is connected to the second word line, and applies a read voltage within a range of a ground voltage (inclusive) to a power supply voltage (exclusive) to the second word line in reading data.

2. The device according to claim 1, wherein
    when the first word line is deactivated, the first transfer gate sets the first power node at the same voltage as a voltage of the first bit line by a leakage current of the first transfer gate itself, and
    when the first word line is deactivated, the second transfer gate sets the second power node at the same voltage as a voltage of the second bit line by a leakage current of the second transfer gate itself.

3. The device according to claim 1, wherein threshold voltages of the first transfer gate and the second transfer gate are lower than threshold voltages of P-type transistors included in the first inverter circuit and the second inverter circuit.

4. The device according to claim 3, wherein gate lengths of the first transfer gate and the second transfer gate are shorter than gate lengths of the P-type transistors included in the first inverter circuit and the second inverter circuit.

5. The device according to claim 1, wherein the read voltage is set at the ground voltage.

6. The device according to claim 1, wherein the application circuit includes:
    a third read transistor formed by an N-type transistor, the third read transistor having a source terminal which receives the read voltage, and having a drain terminal connected to the second word line; and
    a signal generation circuit which supplies a high-level signal to a gate terminal of the third read transistor in reading data.

7. The device according to claim 6, wherein the application circuit includes a voltage generation circuit which generates the read voltage.

8. The device according to claim 1, wherein
the first inverter circuit includes a first load transistor and a first drive transistor connected in series with each other,
the second inverter circuit includes a second load transistor and a second drive transistor connected in series with each other,
the first load transistor and the second load transistor are formed by P-type transistors, and
the first drive transistor and the second drive transistor are formed by N-type transistors.

9. The device according to claim 1, wherein the first word line is set at low level in activation and set at high level in deactivation.

10. The device according to claim 1, wherein the first storage node and the second storage node store complementary data.

11. A semiconductor memory device comprising:
a first inverter circuit and a second inverter circuit formed by transistors;
a first storage node connected to an output terminal of the first inverter circuit and an input terminal of the second inverter circuit;
a second storage node connected to an input terminal of the first inverter circuit and an output terminal of the second inverter circuit;
a first transfer gate which is connected between a first power node of the first inverter circuit and a first bit line, and formed by an N-type transistor;
a second transfer gate which is connected between a second power node of the second inverter circuit and a second bit line, and formed by an N-type transistor;
a first word line connected to gate terminals of the first transfer gate and the second transfer gate;
a first read transistor which is connected between the first power node and a second word line, and formed by a P-type transistor having a gate terminal connected to the second storage node;
a second read transistor which is connected between the second power node and the second word line, and formed by a P-type transistor having a gate terminal connected to the first storage node; and
an application circuit which is connected to the second word line, and applies a read voltage within a range of a ground voltage (exclusive) to a power supply voltage (inclusive) to the second word line in reading data.

12. The device according to claim 11, wherein
when the first word line is deactivated, the first transfer gate sets the first power node at the same voltage as a voltage of the first bit line by a leakage current of the first transfer gate itself, and
when the first word line is deactivated, the second transfer gate sets the second power node at the same voltage as a voltage of the second bit line by a leakage current of the second transfer gate itself.

13. The device according to claim 11, wherein threshold voltages of the first transfer gate and the second transfer gate are lower than threshold voltages of N-type transistors included in the first inverter circuit and the second inverter circuit.

14. The device according to claim 13, wherein gate lengths of the first transfer gate and the second transfer gate are shorter than gate lengths of the N-type transistors included in the first inverter circuit and the second inverter circuit.

15. The device according to claim 11, wherein the read voltage is set at the power supply voltage.

16. The device according to claim 11, wherein the application circuit includes:
a third read transistor formed by a P-type transistor, the third read transistor having a source terminal which receives the read voltage, and having a drain terminal connected to the second word line; and
a signal generation circuit which supplies a low-level signal to a gate terminal of the third read transistor in reading data.

17. The device according to claim 16, wherein the application circuit includes a voltage generation circuit which generates the read voltage.

18. The device according to claim 11, wherein
the first inverter circuit includes a first drive transistor and a first load transistor connected in series with each other,
the second inverter circuit includes a second drive transistor and a second load transistor connected in series with each other,
the first drive transistor and the second drive transistor are formed by P-type transistors, and
the first load transistor and the second load transistor are formed by N-type transistors.

19. The device according to claim 11, wherein the first word line is set at high level in activation and set at low level in deactivation.

20. The device according to claim 11, wherein the first storage node and the second storage node store complementary data.

* * * * *